(12) United States Patent
Thiele

(10) Patent No.: US 7,835,129 B2
(45) Date of Patent: Nov. 16, 2010

(54) CIRCUIT ARRANGEMENT FOR OVERTEMPERATURE DETECTION

(75) Inventor: Steffen Thiele, Munich (DE)

(73) Assignee: Infineon Technologies AG, Munich (DE)

( * ) Notice: Subject to any disclaimer, the term of this patent is extended or adjusted under 35 U.S.C. 154(b) by 690 days.

(21) Appl. No.: 11/731,765

(22) Filed: Mar. 29, 2007

(65) Prior Publication Data

US 2007/0274016 A1 Nov. 29, 2007

(30) Foreign Application Priority Data

Mar. 29, 2006 (DE) .................. 10 2006 014 523

(51) Int. Cl.
*H02H 5/00* (2006.01)
*H02H 5/04* (2006.01)
(52) U.S. Cl. .................. 361/103; 361/93.8; 361/24
(58) Field of Classification Search ............... 361/103, 361/93.8, 24
See application file for complete search history.

(56) References Cited

U.S. PATENT DOCUMENTS

| 4,133,208 | A | * | 1/1979 | Parlanti ....................... 374/165 |
| 4,971,921 | A | * | 11/1990 | Fukunaga et al. ............. 438/54 |
| 5,049,961 | A | * | 9/1991 | Zommer et al. ............. 257/470 |
| 5,070,322 | A | * | 12/1991 | Fujihira ....................... 340/653 |
| 5,237,481 | A | * | 8/1993 | Soo et al. .................... 361/103 |
| 5,918,982 | A | * | 7/1999 | Nagata et al. ............... 374/178 |
| 6,137,668 | A | | 10/2000 | Feldtkeller |
| 6,205,010 | B1 | | 3/2001 | Ohsaka et al. |
| 6,252,208 | B1 | * | 6/2001 | Topp ........................... 219/497 |
| 6,504,697 | B1 | * | 1/2003 | Hille ........................... 361/103 |
| 6,770,985 | B2 | | 8/2004 | Yabe et al. |
| 6,787,799 | B2 | | 9/2004 | Asam et al. |
| 6,930,371 | B2 | | 8/2005 | Necco et al. |
| 2004/0246642 | A1 | | 12/2004 | Ball |
| 2007/0076342 | A1 | * | 4/2007 | Arndt ........................... 361/103 |

FOREIGN PATENT DOCUMENTS

DE 10135805 A1 2/2003
JP 63299264 A 12/1988

OTHER PUBLICATIONS

LM9061 Data Sheet, Apr. 1995, National Semiconductor Corp., pp. 1-10.*
Jens Peer Stengl et al., Leistungs-MOS-FET-Praxis, Mit 231 Abbildungen, 1992, 112, Pflaum Verlag KG, Munich, DE.

* cited by examiner

*Primary Examiner*—Stephen W Jackson
*Assistant Examiner*—Zeev Kitov
(74) *Attorney, Agent, or Firm*—Maginot, Moore & Beck

(57) ABSTRACT

The invention relates to a circuit arrangement for detecting the overtemperature of a semiconductor body. The arrangement comprises at least one field effect transistor, having a parasitic diode, which is integrated in the semiconductor body, wherein the parasitic diode connects a load terminal of the field effect transistor to a bulk terminal of the semiconductor body, and comprising an evaluating unit electrically connected to the parasitic diode via the bulk terminal at the semiconductor body, which is constructed for feeding a current into the parasitic diode and evaluating a temperature-dependent voltage drop across the parasitic diode, the direction of the current fed into the diode being such that it is operated in the forward direction.

17 Claims, 7 Drawing Sheets

CIRCUIT ARRANGEMENT FOR OVERTEMPERATURE DETECTION

CROSS-REFERENCE TO RELATED APPLICATIONS

This application claims priority from German patent application no. 10 2006 014 523.2-33, filed Mar. 29, 2006, the contents of which are incorporated herein by reference.

TECHNICAL FIELD

The invention relates to a circuit arrangement for overtemperature detection in transistors, particularly power transistors.

BACKGROUND

Power transistors are transistors which provide for large current and voltage amplitudes and are thus suitable for directly operating loads with relatively large powers. Power transistors are used, for example, in output stages and switching stages for industrial electronics and motor vehicle engineering.

In this context, the temperature of a power transistor represents a significant factor for its functional capability. An overtemperature of the power transistor, generated, for example, by a higher ambient temperature or by malfunction such as a short circuit of loads, can lead to it being damaged or destroyed and in addition can also lead to impairment or even destruction of the load. It is essential, therefore, to detect any overtemperature of power transistors in time and reliably in order to be able to take suitable measures such as, for example, switching off the transistor or the load before critical temperature values and thus the damage limit are/is reached.

To determine the temperature of a semiconductor component, a temperature sensor can be attached to the package of the semiconductor component or to its semiconductor body/chip. It can be inappropriate that the sensor and the actual semiconductor component are two separate components, as a result of which the sensor only detects the temperature externally on the semiconductor component which can deviate considerably from the temperature in the interior of the semiconductor component and, in addition, has an unwanted inertia in the case of rapid temperature changes in the interior of the semiconductor component. It is precisely the temperature in the interior of the semiconductor body, however, which is relevant to the determination of critical operating states.

There is a general need for a circuit arrangement with a temperature sensor which is integrated into the same semiconductor body like the power transistor, where the temperature sensor reliably provides a voltage dependent on the temperature in the interior of the semiconductor body.

SUMMARY

In one embodiment of the invention a diode structure is additionally integrated into a semiconductor body. The diode structure is fed with a current in its forward direction from a current source. The voltage drop across the diode structure is dependent on the temperature of the diode structure and thus on the temperature of the transistor structure, and can therefore be used for overtemperature detection by an evaluating unit, wherein the protection of the power transistor and of the co-integrated temperature sensor due to undesirable destruction guaranteed by the evaluating unit.

Using a diode structure integrated into the semiconductor body, which is fed in the forward direction (not in the reverse direction) by a current (not by a voltage) provides for a large signal swing, and due to the fact that a switching element located in the evaluating unit actively produces a short circuit between the bulk of the semiconductor body and the source of the power transistor when this is required due to the operating state of the power transistor or of the evaluating unit, which for the first time enables the arrangement according to at least one embodiment of the invention to be used for overtemperature detection in n-channel LS switches and in p-channel HS switches.

Further advantages can also be obtained if the (for example separate, particularly external) evaluating unit for detecting the overtemperature and the power transistor structure are thermally decoupled from one another, which has a positive influence on the accuracy and reliability of the evaluating unit, and due to the fact that the influence of the ambient temperature on the power transistor structure and the evaluating unit can be taken into consideration.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1:
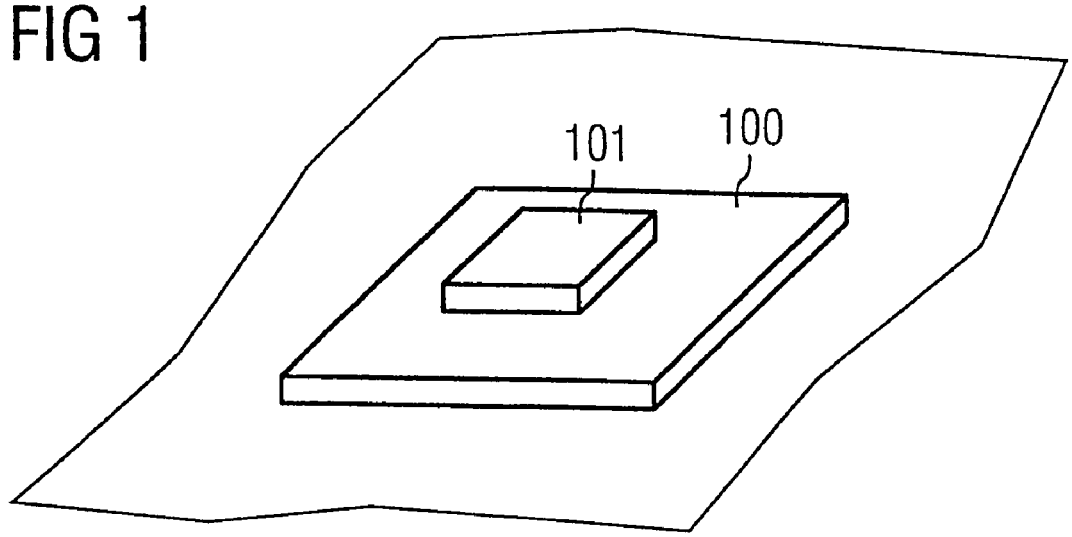
FIG. 1 shows the chip-on-chip technology for measuring the temperature.

To determine the temperature of a semiconductor component 100, a temperature sensor 101 can be attached to the package of the semiconductor component 100 or to its semiconductor body/chip (see FIG. 1). Sometimes it can be useful that the sensor and the actual semiconductor component are not two separate components, as a result of which the sensor only detects the temperature externally on the semiconductor component which can deviate considerably from the temperature in the interior of the semiconductor component and, in addition, has an unwanted inertia in the case of rapid temperature changes in the interior of the semiconductor component. It is precisely the temperature in the interior of the semiconductor body, however, which is relevant to the determination of critical operating states.

To determine the internal temperature of a semiconductor component, diode structure may be provided in the same semiconductor body in which the semiconductor component is integrated, the diode structure being connected to a supply voltage.

Figure 2:
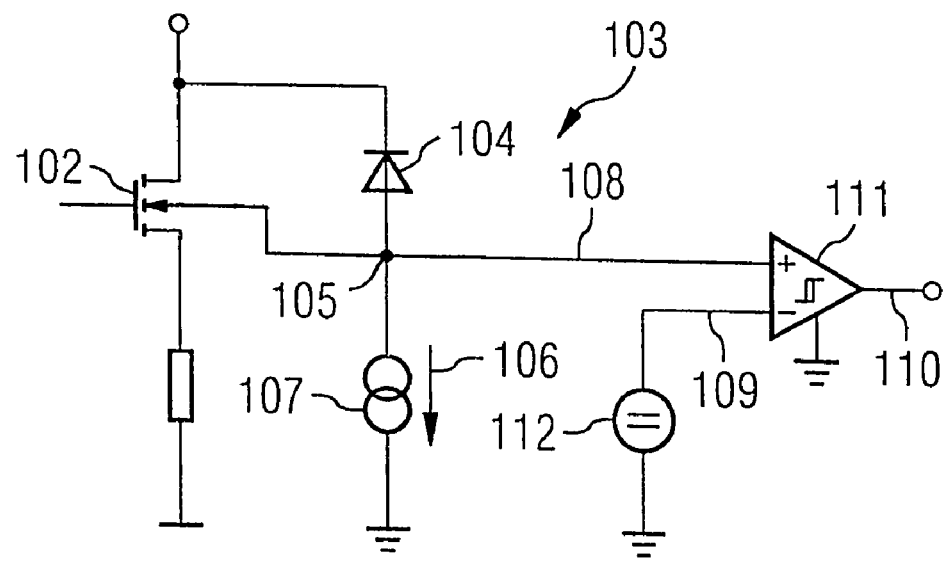
FIG. 2 shows the measurement of the leakage current of an integrated diode in the reverse direction at the n-channel HS switch.

FIG. 2 shows an example of an n-channel HS switch (HS=High Side; LS=Low Side). The arrangement according to FIG. 2 comprises a power transistor structure 102 integrated in a semiconductor body and an evaluating unit 103, electrically connected to the former, for overtemperature detection of the power transistor structure 102. In addition to the power transistor structure 102, a reverse-biased bipolar diode structure 104 is also integrated in the semiconductor body, which is fed from a current source 107 located in the separate evaluating unit 103 via an additional body or bulk terminal 105 on the semiconductor body by a reference current 106 in the reverse direction of the diode structure 104. The diode structure 104 can be formed, e.g., by the bulk drain diode always present in a MOSFET. The usual short circuit between source and bulk does not exist in this and the following embodiments.

The measuring voltage 108 dropped accordingly across the diode structure 104 and dependent on the temperature of the diode structure 104 and thus on the temperature of the semiconductor body and thus, in turn, on the temperature of the power transistor structure 102 is compared with a comparison voltage 109 in the evaluating unit 103 in order to generate from this a signal 110 identifying an overtemperature. In this arrangement, the voltage 109 of a voltage source 112, present at one input of a comparator 111, is compared with the voltage 108 at the body terminal 105 of the diode structure 104. If the voltage at the body terminal 105 of the diode structure 104 exceeds the permanently preset value of the reference voltage source 112, the signal state at the output of the comparator 111 changes and generates the signal 110 identifying an overtemperature of the power transistor. In this way, the diode structure 104 is used as temperature sensor for the temperature of the power transistor structure 102, the diode structure 104 being operated in the reverse direction with an impressed current.

This makes use of the fact that the reverse current of the diode structure, detected by an evaluating unit, is exponentially dependent on the temperature so that the temperature in the semiconductor body can be inferred from the reverse current. If the reverse current of the diode structure 104 exceeds the current 106 predetermined by the current source 107, the voltage at the body terminal 105 changes and the voltage drop across the diode structure 104 drops. In consequence of this process, the comparator 111 generates the overtemperature signal 110 as described. However, this reverse current exhibits a significant, that is to say analyzable, amount only at high temperatures due to the exponential characteristic, so that the signal deviation of such a diode structure temperature sensor is small.

Although it is possible to partially compensate for this disadvantage by constructing the diode structure with the greatest possible area, this runs counter to the general demand for the highest possible degree of miniaturization of semiconductor components. In addition, diode structures always have a barrier layer capacitance in which a charge is stored. This stored charge can cause a current which may be greater than the reverse current used for temperature detection which unacceptably influences the measurement result.

Furthermore, the power transistor structure can also be arranged as p-channel LS switch in the arrangement according to FIG. 2. The aforementioned disadvantages with regard to temperature range, signal deviation also exist in this case.

For determining the internal temperature of a semiconductor component, a diode structure may be provided in the same semiconductor body in which the semiconductor component is integrated, the diode structure being operated by an impressed current in its forward direction. The circuit arrangement according to FIG. 3 again comprises a power transistor structure 102 integrated in a semiconductor body and an evaluating unit 103 electrically connected to the former, for detecting overtemperature of the power transistor structure 102 which is only used for representing the basic principle in this case. In addition to the power transistor structure 102, a bipolar diode structure 104 is again also integrated in the semiconductor body, which diode structure is fed from the current source 107 located in the separate evaluating unit 103 via the additional body terminal 105 at the semiconductor body via the reference current 106 in the forward direction of the diode structure 104 compared with FIG. 2.

The voltage 108 correspondingly dropped across the diode structure 104, which is dependent on the temperature of the diode structure 104 and thus on the temperature of the semiconductor body and thus, in turn, on the temperature of the power transistor structure 102 is again compared with a comparison voltage 109 in the evaluating unit 103 in order to generate from this, analogously to the circuit arrangement in FIG. 2, a signal 110 identifying an overtemperature. Apart from the exemplary embodiment of the power transistor structure 102 as n-channel HS switch, the power transistor structure 102 in FIG. 3 can also be constructed as p-channel LS switch.

Figure 3:
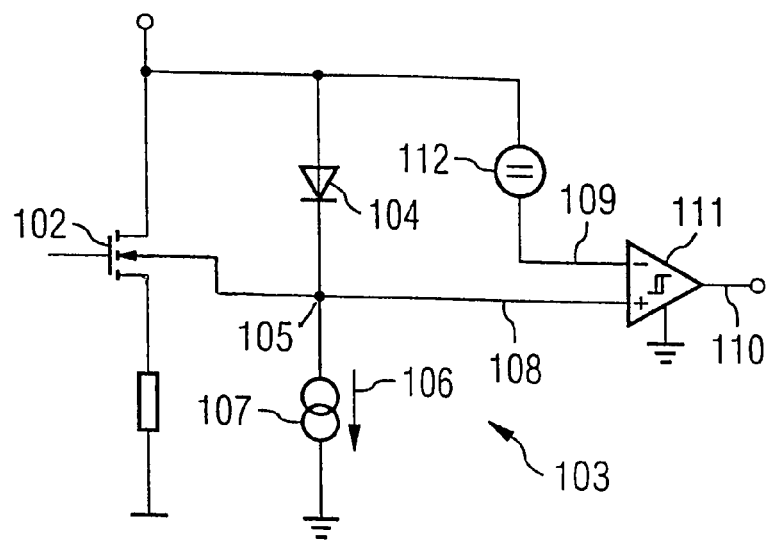
FIG. 3 shows the measurement of the diode voltage of a forward-polarized diode on the exemplary n-channel HS switch.

The disadvantageous effect is here that for such an arrangement of the diode structure 104 according to FIG. 3, in the case of an n-channel LS switch, the corresponding supply voltage is not constantly applied to the drain terminal of the power transistor structure 102 but that, due to, e.g., switching processes of the power transistor structure, the voltage 108 dropped across the diode structure 104 in dependence on the temperature is subject to large voltage swings. An additional disadvantageous factor is that, for the arrangement according to FIG. 3, in the case of a p-channel HS switch, ground potential is not constantly applied to the drain terminal of the power transistor structure 102 but, due to, e.g., switching processes of the power transistor structure, the voltage 108 dropped across the diode structure 104 in dependence on temperature is also subject to large voltage swings. It is also a disadvantageous factor that the opening of the bulk-source short circuit produced by the diode structure 104 also being integrated no longer guarantees the dielectric strength of the power transistor. At a high voltage between drain and source of the power transistor structure 102, this can lead to a voltage breakdown which takes place at a lower voltage than defined by the voltage class of the power transistor structure which is specified with the bulk short circuited with the source. In addition, the high voltage between source and drain produces a high voltage between collector and emitter of an NPN transistor formed from two individual diode structures.

Figure 4:
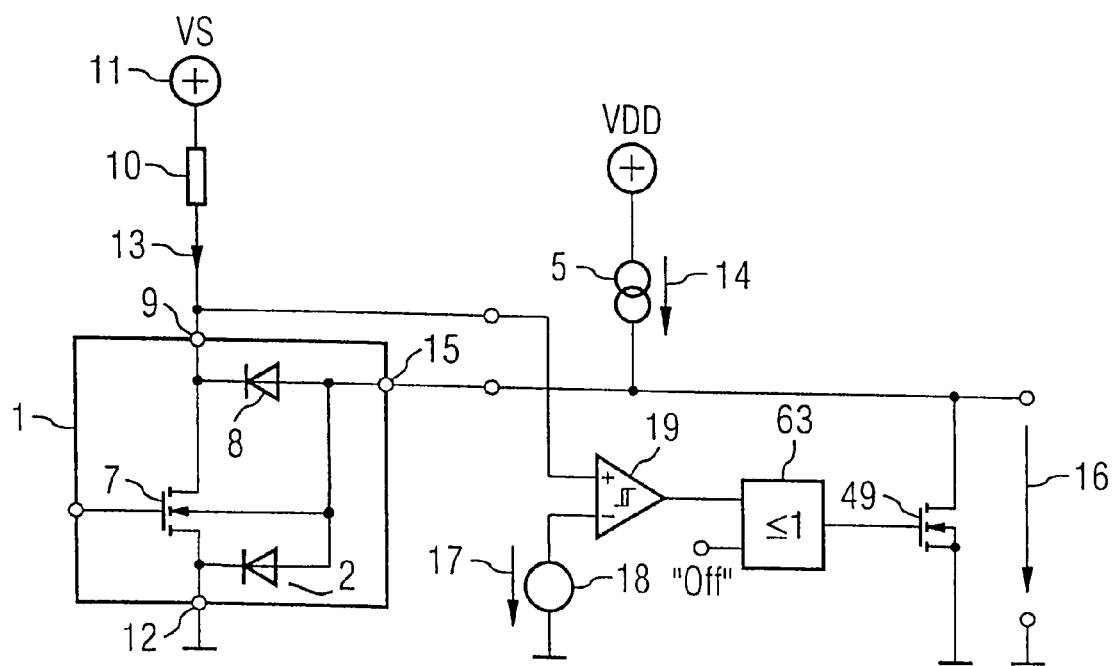
FIG. 4 shows an n-channel LS switch and a parasitic diode structure.

The circuit diagram according to FIG. 4 shows a power transistor 1, constructed as n-channel LS switch, including a parasitic diode structure 8, which is always present when MOS technology is used, which is located in the reverse direction between bulk terminal 15 and drain terminal 9. The parasitic diode structure 8 can be formed by the bulk-drain diode always present in MOS transistors.

Compared with FIG. 3, the arrangement according to FIG. 4 thus additionally takes into consideration the parasitic diode structure 8 which always exists in MOS transistors but which was neglected in the preceding figures. In this arrangement, a power transistor structure 7 is connected with its drain terminal 9 via an external load resistor 10 to a positive supply potential 11 and with its source terminal 12 to ground potential, as a result of which a load current 13, flowing into the drain terminal 9 of the power transistor structure 7, can be generated in dependence on a voltage, not designated in greater detail here, on the gate terminal of the power transistor structure 7. Furthermore, the co-integrated diode structure 2 (e.g. the bulk-source diode which must not be short circuited in the present case) is connected in series opposition to the parasitic diode structure 8 (e.g. the bulk-drain diode) and the diode structures 2 and 8 are connected in parallel with the load path of the power transistor structure 7. A bulk-source diode structure 2 is operated in the forward direction with an impressed current 14 as a result of which a voltage 16 dropped across the diode structure 2 is generated.

This voltage 16 is not equal to the load path voltage of the power transistor structure 7 and is used for overtemperature detection of the power transistor. Furthermore, the voltage across the load path at drain 9 is compared with a preset voltage value 17 of a reference voltage source 18. In the present case, this comparison takes place via a comparator 19, to the inverting input of which the preset comparison voltage 17 is applied and the non-inverting input of which is connected to the drain terminal 9 of the power transistor structure 7 of the semiconductor body 1. The comparator 19 can suitably have a switching characteristic with hysteresis.

If the voltage present at the drain terminal 9 of the power transistor structure 7 exceeds the value of the comparison voltage 17, the state of the signal at the output of the comparator 19 changes and short circuits the diode structure 2 via a transistor structure 49. A short circuit of the diode structure 2 also takes place due to the switching-through of the transistor structure 49 if then a control signal "OFF" is activated, this control signal "OFF" and the output of the comparator 19 being linked via an OR gate 63 preceding the gate of the transistor structure 49.

It has an advantageous effect that the bulk-source diode (co-integrated diode structure 2) can be used as sensor element for the temperature measurement without reducing the dielectric or break-down strength of the power transistor. This is achieved by the fact that the bulk-source short circuit of the power transistor is only temporarily opened for a permissible range of the voltage, predetermined by the reference voltage 17, at the drain of the power transistor which is below the hazard limit for the effects mentioned above. It also has an advantageous effect that no current flow generated by the impressed current 14 takes place at the source and the drain output of the power transistor if this is switched off (active "OFF" signal). It also has an advantageous effect that a temperature measurement is now possible with the power transistor switched on and thus a low load path voltage between drain and source of the power transistor (voltage at drain 9 lower than reference voltage 17). A further possible embodiment is obtained from specifying a maximum permissible voltage at the load path for the temperature measurement, which can also be monitored by measuring the operating voltage, for example in bridge circuits.

Figure 5:
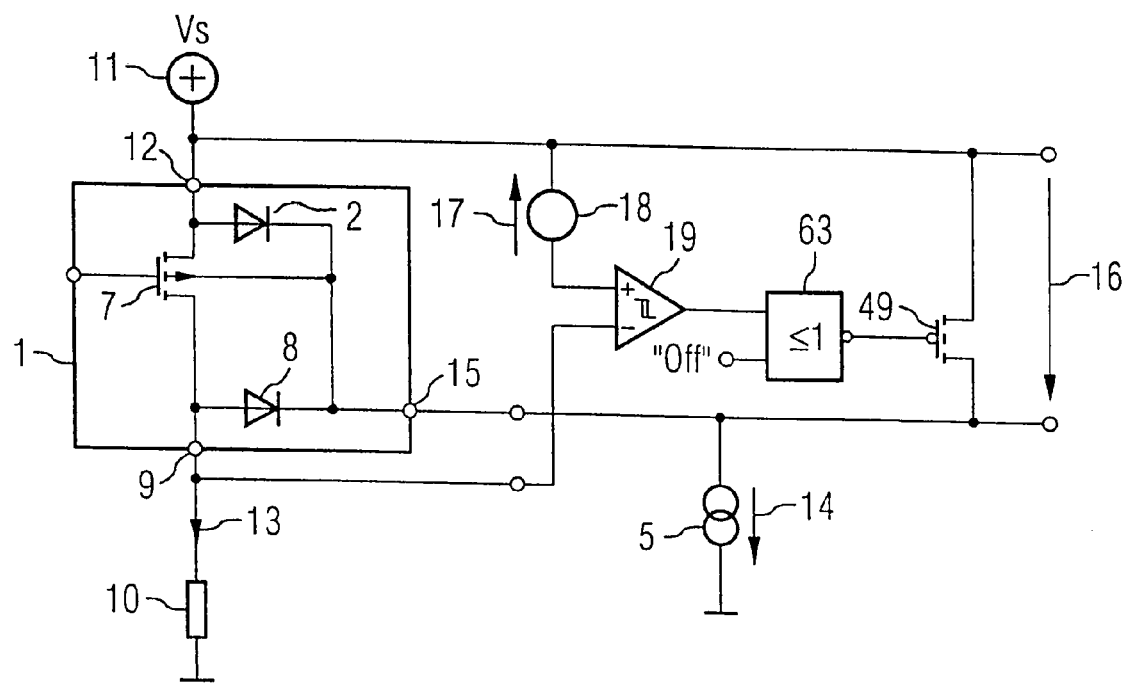
FIG. 5 shows a p-channel HS switch and a parasitic diode structure.

The circuit diagram of FIG. 5 shows the basic principle of an arrangement with a power transistor constructed as p-channel HS switch, including the parasitic diode structure 8, which is always present when using MOS technology, which is located in the reverse direction between drain terminal 9 and bulk terminal 15 (parasitic drain-bulk diode), and the diode structure 2 (source-bulk diode). The evaluating unit also shown corresponds to that of FIG. 4 and is only slightly less adapted to the changed application.

The arrangement according to FIG. 5 again comprises the parasitic diode structure 8. The power transistor structure 7 is now connected with its drain terminal 9 to ground via an external load resistor 10 and connected to a positive supply potential 11 with its source terminal 12, as a result of which a load current 13 flowing from the drain terminal 9 of the power transistor structure 7 is generated in dependence on the voltage at the gate terminal. Furthermore, the co-integrated diode structure 2 (source-bulk diode) is connected in series opposition to the parasitic diode structure 8 (drain-bulk diode) and the diode structures 2 and 8 are connected in parallel with the load path of the power transistor structure 7.

In this arrangement, the source-bulk diode structure 2 is operated with the impressed current 14 in the forward direction, as a result of which the voltage 16 dropped across the diode structure 2 is generated. This voltage 16 is used for overtemperature detection of the power transistor. Furthermore, the voltage at the drain terminal 9 of the power transistor is compared with the preset voltage value 17 of the reference voltage source 18. In the present case, this comparison is made via the comparator 19, to the positive input of which the preset comparison voltage 17 is applied and the negative input of which is connected to the drain terminal 9 of the power transistor structure 7. The comparator 19 can suitably have a switching characteristic with hysteresis.

If the voltage across the load path exceeds the value of the comparison voltage 17, the state of the signal at the output of the comparator 19 changes and short circuits the diode structure 2 via the transistor structure 49. A short circuit of the diode structure 2 due to the switching-though of the transistor structure 49 also occurs when the control signal "OFF" is activated, this control signal "OFF" and the output of the comparator 19 being linked via the NOR gate 68 preceding the gate terminal of the transistor structure 49. This again results in the same advantageous effects as in the arrangement from FIG. 4. The operating voltage can also be monitored again, e.g. in bridge circuits, in order to prevent the maximum permissible load path voltage possibly being exceeded whilst the bulk-source short circuit is opened at the same time.

Figure 6:
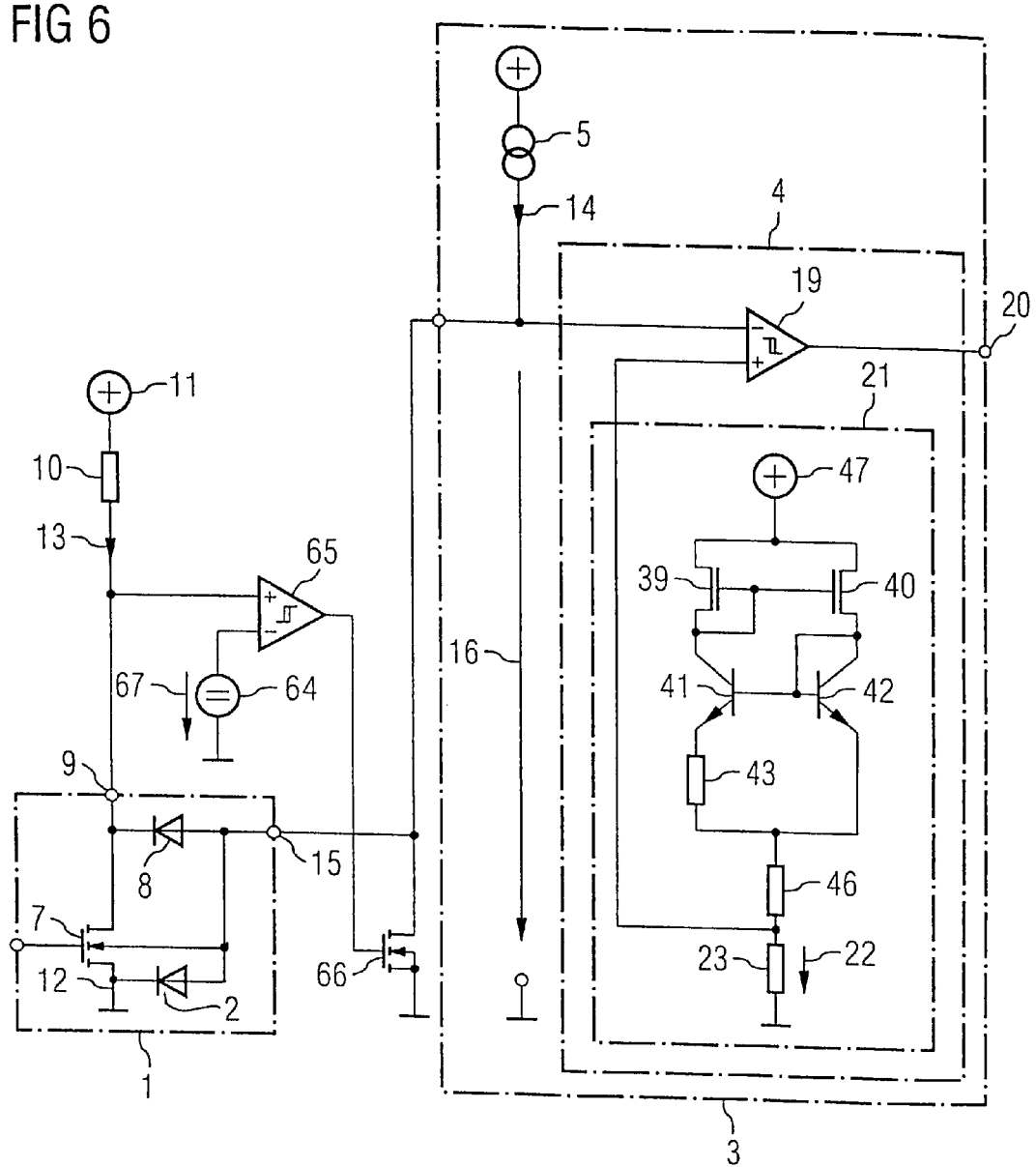
FIG. 6 is a circuit diagram of a temperature sensor integrated in a semiconductor body, with parasitic diode structure and a separate evaluating unit, taking into consideration the ambient temperature, according to a first embodiment of the invention.

The circuit arrangement according to FIG. 6 comprises a power transistor structure 7 integrated in a semiconductor body 1 and an evaluating unit 3, which is electrically connected to the former but is spatially separate and thermally decoupled from it, for overtemperature detection of the power transistor structure 7. In the power transistor structure 7, which, in the present case, is an n-channel MOS field effect transistor but could equally be a bipolar transistor, IGBT, thyristor etc., a bipolar diode structure 2 is co-integrated in the semiconductor body 1 in addition to the power transistor structure 7, which diode structure is fed from a current source 5 located in the separate evaluating unit 3 via an additional body or bulk terminal 15 at the semiconductor body 1 by a reference current 14 in the forward direction of the diode structure 2. The voltage 16 correspondingly dropped across the diode structure 2, dependent on the temperature of the diode structure 2 and thus on the temperature of the power transistor structure 7, is compared with a comparison voltage 22 in the evaluating unit 3 in order to generate from it a signal 20 identifying an overtemperature. In this way, the diode structure 2 (the bulk-source diode in the case shown) is used as temperature sensor for the temperature of the power transistor structure 7, the diode structure 2 being operated in the forward direction with an impressed current.

FIG. 6 also comprises the parasitic bulk-drain diode structure 8 which is always present when MOS technologies are used, and forms a bipolar transistor together with the diode structure 2. A device of comparator 65 and reference voltage source 64 for monitoring the load path voltage at the drain 9 is also contained therein.

The circuit arrangement according to FIG. 6 additionally contains a monitoring circuit with a reference voltage source 64 for generating a reference voltage 67, a comparator 65 (possibly with hysteresis) and an MOS field effect transistor 66. In this arrangement, the non-inverting input of the comparator 65 is connected to the drain terminal 9 of the power transistor structure 7 and the reference voltage 67 is present at the inverting input of the comparator 65. The output of the comparator 65 is connected to the gate of the transistor 66. The drain terminal of the transistor 66 is connected to the body terminal 15 of the semiconductor body 1 and the current source 5 whilst the source terminal of the transistor 66 is connected to ground.

The monitoring circuit has the purpose of monitoring the amplitude of the voltage at the drain terminal 9 of the power transistor structure 7 and comparing it with the preset reference voltage 67. In this way, an excessive voltage at the drain terminal 9 of the power transistor structure 7 is detected which, with the bulk-source short circuit being opened at the same time and the dielectric strength of the semiconductor structure 1 thus being reduced, can lead to its destruction. The reference voltage 67 can be selected to be very low so that temperature detection is only carried out when the load path, represented by the resistor 10, via the power transistor structure 7 is connected. The reference voltage 67 can also assume higher values as long as its value is below the critical maximum load path voltage leading to a destruction, which is reduced by the source-bulk short circuit being opened.

If then the voltage to ground, present at the drain terminal 9, exceeds the value of the reference voltage 67, for example because the load path is not connected, the gate of the transistor 66 is driven via the output of the comparator 65 and the diode structure 2 is short circuited via the transistor 66 as a result of which the current used for overtemperature detection (largely) does not flow through the diode structure 2 but (largely) flows through the source-drain path of the transistor 66. In this case, however, the signal 20 cannot be used as a measure of an overtemperature detection since the voltage 16 dropped across the short circuited diode structure 2 is then always very low independently of the actual temperature of the power transistor structure 7 and the voltage 16 is thus always lower than the voltage 22 used for the comparison and for detecting an overtemperature.

The effect, which can be reproduced quantitatively, that the voltage occurring at a diode structure operated in the forward direction with the impressed current depends on the temperature of this diode structure is utilized in such a manner that due to the conductance of the diode structure, which rises with temperature, the voltage dropped across the diode structure with a constant impressed current is reduced. The forward voltage of a diode structure changes linearly with about $-2$ mV per degree Celsius (° C.).

The diode structure 2 used for temperature measurement is co-integrated into the semiconductor body 1 in such a manner that, in operation, it is essentially subject to the same heating as the power transistor structure 7 itself and thus can be used as a measure of the operating temperature of the power transistor structure 7 and thus for overtemperature detection of the power transistor structure 7. The additional, externally accessible body or bulk terminal 15 is provided at the semiconductor body 1 for the purpose of feeding the current 14 into the diode structure 2 and for measuring the voltage 16 dropped across this diode structure 2 (in the case of an external evaluating circuit as in the present case).

In the circuit arrangement according to FIG. 6, the diode structure 2 is connected in the forward direction between body and ground. A further diode structure 8 is located between body (and thus body terminal 15) and drain terminal 9 of the power transistor structure 7, this being the parasitic bulk-drain diode structure always present. In this arrangement, the power transistor structure 7 is connected with its drain terminal 9 with a positive supply potential 11 via an external load resistor 10 and with its source terminal 12 to ground potential as a result of which a load current 13 flowing into the drain terminal 9 of the power transistor structure 7 can be generated.

As already explained, the circuit arrangement according to FIG. 6 comprises a current source 5 for generating the impressed current 14 for the diode structure 2 and additionally a first embodiment of a comparison circuit 4 for comparing the voltage 16 dropped across the diode structure 2 with a preset comparison voltage 22. In the present case, the comparison circuit 4 consists of a comparator 19, to the positive input of which a preset comparison voltage 22 generated by a circuit 21 is applied and the negative input of which is connected to the terminal 15 of the semiconductor body 1 and to which voltage 16 dropped across the diode structure 2 is thus applied. The comparator 19 can suitably have a switching characteristic with hysteresis.

In this arrangement, the circuit 21 is constructed in such a manner that the comparison voltage 22 generated by it is temperature-dependent, in such a manner that an increase in temperature of the evaluating unit 3, and thus an increase in temperature of the circuit 21, leads to an increase in the comparison voltage 22 generated from it.

An increase in temperature of the evaluating unit 3 occurs, for example, if the ambient temperature increases at which the evaluating unit 3 and correspondingly also the semiconductor body 1 are operated. This is the case, for instance, in applications in a motor vehicle where semiconductor bodies and circuits used in the engine compartment are heated to a different degree by radiation of engine heat in dependence on the operating state and weather-related external temperatures. In this manner, the limit value of the overtemperature to be determined can be automatically adapted to the prevailing ambient temperatures, for example reduced, in order thus to take into account, for example, the circumstance that a value of the overtemperature which is critical or damaging for the operation is lower at high ambient temperatures than at low ambient temperatures.

The prerequisite for taking the ambient temperature into consideration with sufficient accuracy is that the semiconductor body 1 and the evaluating unit 3 are thermally decoupled but are placed so close to one another spatially that the same ambient temperature is applied to them. However, thermally decoupling also means, in particular, that the two are not so close that the heat dissipation of the power transistor influences the ambient temperature in the area of the evaluating circuit. In applications in which this ambient temperature is generated, for example by a heat-radiating source such as a motor vehicle engine, this ambient temperature changes very rapidly with distance from the source and a spatially more separate arrangement of the semiconductor body 1 and the evaluating unit 3 would not achieve the desired effect.

According to FIG. 6, the circuit 21 for generating the comparison voltage 22 comprises an MOS field effect transistor 39, an MOS field effect transistor 40, a bipolar transistor 41 and a bipolar transistor 42 and a resistor 23, a resistor 43 and a resistor 46. The transistor 39 is a p-channel MOS field effect transistor and connected with its source terminal to a positive supply potential 47 and to the source terminal of the transistor 40 which is also of the p-channel type. The drain terminal of the transistor 39 is connected to the gate terminal of the transistor 39 and to the collector terminal of the transistor 41; similarly, there is a connection between the gate terminal of the transistor 39 and the gate terminal of the transistor 40. The drain terminal of the transistor 40 is connected to the collector terminal of the transistor 42 which, in turn, is connected to the base terminal of the transistor 42 and to the base terminal of the transistor 41. Furthermore, the emitter terminal of the transistor 42 is connected to the resistor 46 and the emitter terminal of the transistor 41 is connected to the resistor 46 via the resistor 43. The two resistors 46 and 23 represent a voltage divider, the comparison voltage 22 dropped across the resistor 23 being applied to the positive input of the comparator 19.

With a rising ambient temperature acting on the evaluating unit 3 and thus on the components contained in this evaluating unit 3, linearly increasing currents through a first resistor 23, a second resistor 43 and a third resistor 46 are generated in the circuit 21. As a result, a voltage drop 22 rising linearly with the temperature is generated at the first resistor 23, which, in the present embodiment, is used as comparison voltage 22 for later comparison by the comparator 19 with the voltage 16 dropped across the diode structure 2, applied to the negative input of the comparator 19.

In this way, an increase of the ambient temperature acting on the evaluating unit 3, by increasing the comparison voltage 22, leads to a reduction in the difference between the voltage 16 at the diode structure 2 and the comparison voltage 22 as a result of which the limit value for detection of an overtemperature of a power transistor structure 7 is reached earlier. The heating of the semiconductor body 1, and thus of the power transistor structure 7, necessary for reaching the overtemperature is less for high ambient temperatures. At low ambient temperatures, a greater range of heating of the power transistor structure 7 is thus permitted (temperature swing) than is the case at high ambient temperatures.

Corresponding to the circuit arrangements according to FIG. 4 and FIG. 5, the voltage 16 at the diode structure 2 and a comparison voltage 22 are again compared by the comparator 19. The comparison voltage 22 and the impressed current 14 are selected in such a manner that the voltage 16 dropped across the diode structure 2 at permissible operating temperatures of the semiconductor body 1 is greater than the comparison voltage 22 preset in the evaluating unit 3. If the voltage 16 dropped across the diode structure 2 exceeds the value of the comparison voltage 22 with increasing temperature of the semiconductor body 1, and if the voltage 16 is thus lower than the comparison voltage 22, the state of the signal 22 at the output of the comparator 19 changes and thus indicates that an overtemperature of the power transistor structure 7 has been reached. In this case, as stated above, the limit value of the overtemperature to be determined is not preset but is dependent on the ambient temperature acting on the circuit arrangement 21.

The circuit arrangement according to FIG. 7 again contains a semiconductor body 1 and an external, thermally decoupled evaluating unit 3. The structure of the power transistor structure 7 and of the diode structures 2 and 8 is identical with that shown in FIG. 6. In contrast to the embodiments described above, the voltages used for detecting an overtemperature are first converted into corresponding currents, namely voltage 16 into current 25 and comparison voltage 28 into current 26, for the purpose of the evaluation.

This is achieved by a voltage/current converter 24 for converting a voltage 16 dropped across the diode structure 2 into a current 25 and by a voltage/current converter 27 for converting a comparison voltage 28 into a current 26. In this arrangement, the voltage/current converters 24 and 27 are initially reproduced as abstract circuit blocks in FIG. 7. The current 25 generated by the voltage/current converter 24 and the current 26 generated by the voltage/current converter 27 are subtracted at a node 29 and, if necessary, converted into a voltage. The resultant current or the resultant voltage, respectively, are again evaluated by a using a comparator 19 (for example by a comparison with zero).

If the first current 25 generated by converting the voltage 16 measured at the diode structure 2 falls below the value of the second current 26 generated by converting the comparison voltage 28 due to a temperature increase, the state of the signal at the output 20 of the comparator 19 changes and thus indicates that an overtemperature of the power transistor structure 7 has been reached. The limit value of the overtemperature to be determined can be selected freely by suitably choosing the preset comparison voltage 28.

Figure 7:
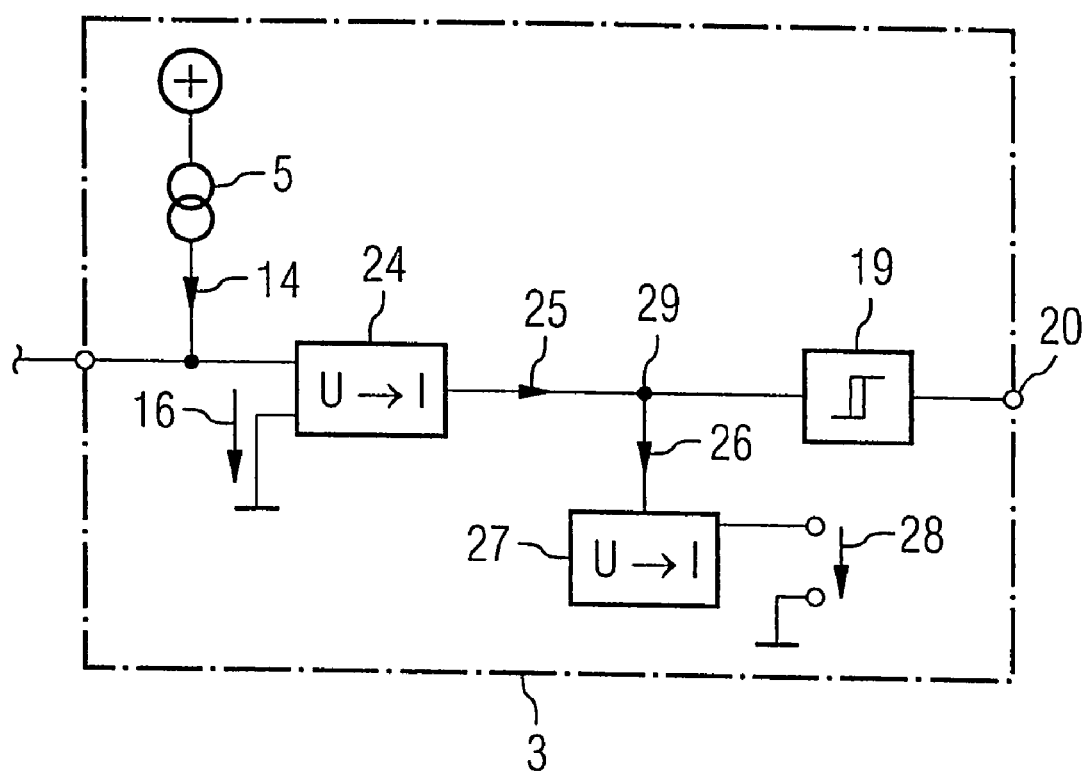
FIG. 7 is a circuit diagram of a temperature sensor integrated in a semiconductor body, with parasitic diode structure and a separate evaluating unit with voltage/current converters according to a second embodiment of the invention.
Figure 8:
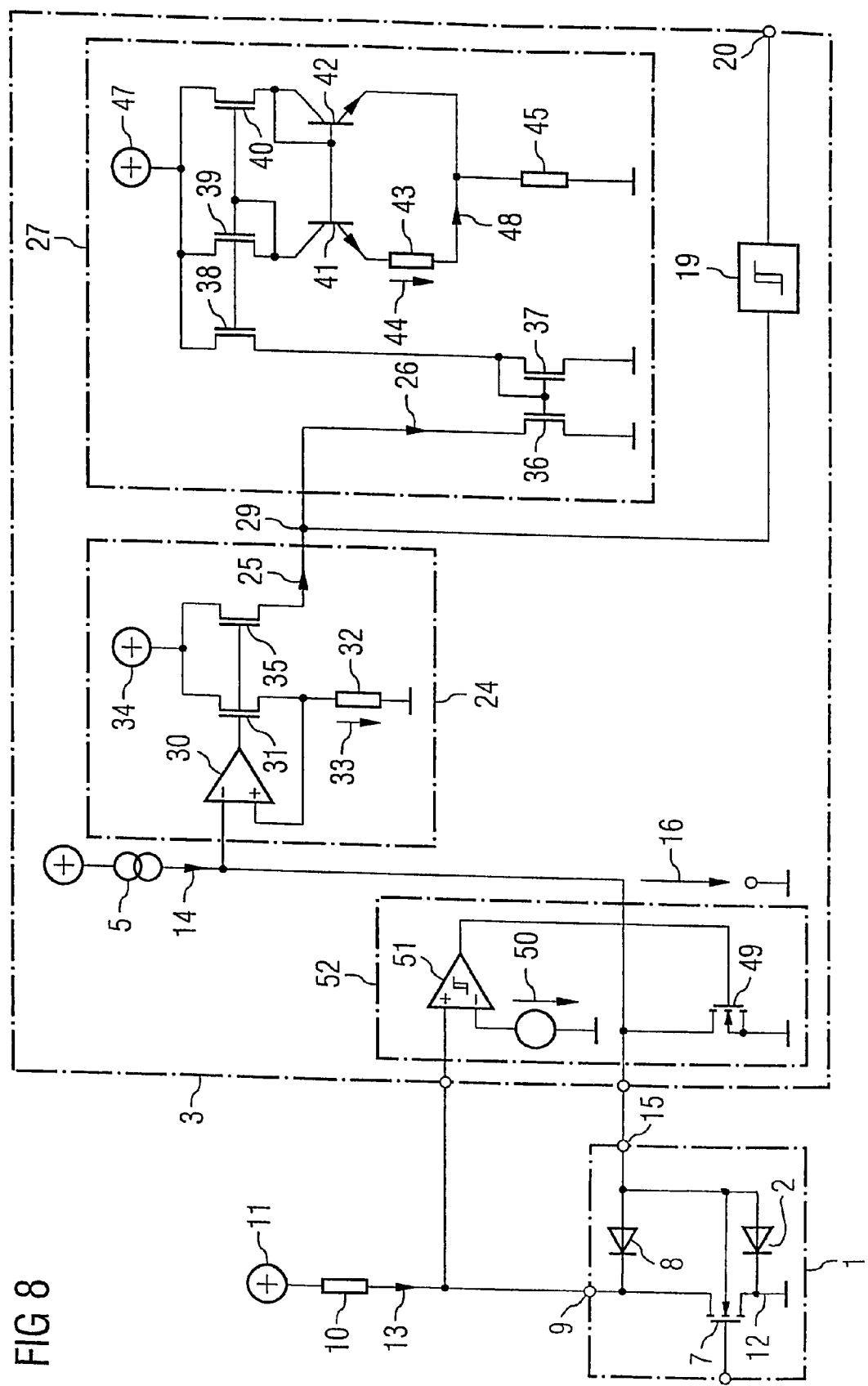
FIG. 8 is a circuit diagram of a temperature sensor integrated in a semiconductor body, with parasitic diode structure and a separate evaluating unit with monitoring of the voltage at the drain terminal of the power transistor structure according to a third embodiment of the invention.

FIG. 8 shows a development of the circuit arrangement shown in FIG. 7, with voltage/current converter 24 and voltage/current converter 27. In this arrangement, the voltage/current converter 24 contains an operational amplifier 30, an MOS field effect transistor 31, an MOS field effect transistor 35 and a resistor 32 across which a voltage 33 proportional to the voltage 16 dropped across a diode structure 2 is dropped. In the voltage/current converter 24, the gate terminals of the two transistors 31 and 35 are connected to the output of the operational amplifier 30, the source terminals of the transistors 31 and 35 also being connected to one another and being connected to the positive supply potential 34. The drain terminal of the transistor 31 is connected to ground via the resistor 32. The voltage 33 dropped across the resistor 32 is fed back to the non-inverting input of the operational amplifier 30, at the inverting input of which the voltage across the diode structure 2 is present. The operational amplifier 30 corrects the voltage 33 across the resistor 32 in such a manner that it is equal to the voltage across the diode structure 2. The current through the source/drain path of the transistor 31 is thus equal to the ratio of voltage 33 to the value of the resistor 32. Accordingly, the current through the source-drain path of the transistor 35, forming the output current, is then proportional to the current through the source/drain path of the transistor 31 and proportional to the voltage across the diode structure 2, the output current thus becoming lower with increasing temperature of the semiconductor body 1.

The drain terminal of the second transistor 35 is connected to a node 29 so that the current 25 from the voltage/current converter 24 acting as current source flows into the node 29, a current 26 flowing off again via the voltage/current converter 27 acting as current sink so that the difference between the two currents can be evaluated by the comparator 19 (for example by comparison with a fixed threshold or zero). The voltage/current converter 27 is that from the circuit 21, explained in FIG. 6, for generating an ambient-temperature-dependent reference voltage. Accordingly, the circuit 21 again contains the transistor 39, transistor 40, transistor 41 and transistor 42, resistor 43 and resistor 45. In addition, an MOS field effect transistor 36, an MOS field effect transistor 37 and an MOS field effect transistor 38 are provided in the exemplary embodiment according to FIG. 9.

A current, which is proportional to the current 48 through the source-drain path of the transistor 39 flows through the source-drain path of the transistor 38, the source and gate terminals of which are in each case connected to the source and gate terminals of transistor 40, in the manner of a current mirror, just like it does through the source-drain path of transistor 40, so that a current rising linearly with the ambient temperature of the evaluating unit 3, which is defined by the ratio of the voltage 44 dropped across the resistor 43 and the resistance value of the resistor 43, is provided.

The current provided by the transistor 38 is then mirrored by means of a (further) current mirror consisting of transistors 36 and 37, in such a manner that the current 26 flowing off from the node 29 is generated. Due to the current 48 being mirrored twice in the voltage/current converter 27, the current 26 is thus produced which also rises linearly with the ambient temperature of the evaluating unit 3.

From the current 25, depending linearly on the voltage 16 at the diode structure 2 and becoming lower with rising temperature of the semiconductor body 1, the current 26 becoming greater with ambient temperature is subtracted at the node 29. The node 29 is connected to the comparator 19 so that the difference produced by subtracting the currents 25 and 26 at the comparator 19 is a measure of whether the operating temperature of the power transistor structure 7 integrated in the semiconductor body 1 is permissible or not, the relevant limit value being dependent on the ambient temperature represented by the current 26.

If the current 25 drops below the current 26 (for example in the case of the zero-point comparison: current 25−current 26<0), the state of the signal 20 at the output of the comparator 19 changes and thus indicates that an overtemperature of the power transistor 7 has been reached. The heating of the power transistor structure 7 necessary for reaching the overtemperature is thus less at higher ambient temperatures of semiconductor body 1 and evaluating unit 3.

According to the embodiment, a greater heat range of the power transistor structure 7 (temperature swing) is permitted at the same time at low ambient temperatures of the semiconductor body 1 and the evaluating unit 3 than is the case at higher ambient temperatures. A significant advantage consists in that, due to the use of identical materials and possibly identical dimensions in the resistors 32 and 43, the absolute accuracy tolerances of these resistors compensate for the temperature dependences reducing the measuring accuracy and thus allow the absolute accuracies to be distinctly increased.

The circuit arrangement according to FIG. 8 also contains a monitoring circuit 52 with a reference voltage source for generating a reference voltage 50, a comparator 51 (possibly with hysteresis) and an MOS field effect transistor 49. In this arrangement, the non-inverting input of the comparator 51 is connected to the drain terminal 9 of the power transistor structure 7 and a reference voltage 50 is present at the inverting input of the comparator 51. The output of the comparator 51 is connected to the gate of the transistor 49. The drain terminal of the transistor 49 is connected to the body terminal 15 of the semiconductor body 1 and the current source 5 while the source terminal of the transistor 49 is connected to ground.

It is the purpose of the monitoring circuit 52 to monitor the magnitude of the voltage at the drain terminal 9 of the power transistor structure 7 and to compare it with a preset reference voltage 50. In this way, an excessive voltage at the drain terminal 9 of the power transistor structure 7 is detected which, with the bulk-source short circuit being opened at the same time and the dielectric strength of the semiconductor structure 1 thus being reduced, can lead to its destruction. The reference voltage 50 can be selected to be very low in order to carry out temperature detection only when the load path, represented by the resistor 10, is connected via the power transistor structure 7. The reference voltage 50 can also assume higher values as long as its value is below the critical maximum load path voltage leading to a destruction, which is reduced by opening the source-bulk short circuit.

If then the voltage to ground, present at the drain terminal 9, exceeds the value of the reference voltage 50, for example because the load path is not connected, the gate of the transistor 49 is driven via the output of the comparator 51 and the diode structure 2 is short circuited via the transistor 49 as a result of which the current used for overtemperature detection (largely) does not flow through the diode structure 2 but (largely) flows through the source-drain path of the transistor 49. With the load path switched off, the current at the drain terminal 9 is very low in any case. In this case, however, the signal 20 cannot be used as a measure of overtemperature detection since then the voltage 16 dropped across the short circuited diode structure 2 is always very low independently of the actual temperature of the power transistor structure 7 and the current 25 is thus always lower than the current 26 used for the comparison and for detecting an overtemperature. For the case of restoring the source-bulk short circuit with an excessive voltage at the drain 9, it is then no longer possible to monitor the temperature. This state is obtained, for example, with a very high load (short circuit) or a normal switching-off process. Since the temperature monitoring is used in any case for switching off the switch with an excessive temperature and to prevent further power input, this behavior does not have a disadvantageous effect. The dielectric strength of the power transistor, which, in the normal case, is present due to the bulk-source short circuit with the technology used, which is no longer given by using the co-integrated diode structure 2 in the present case, is restored by short circuiting the diode structure 2 via the transistor 49 with excessive voltage values at the drain.

Figure 9:
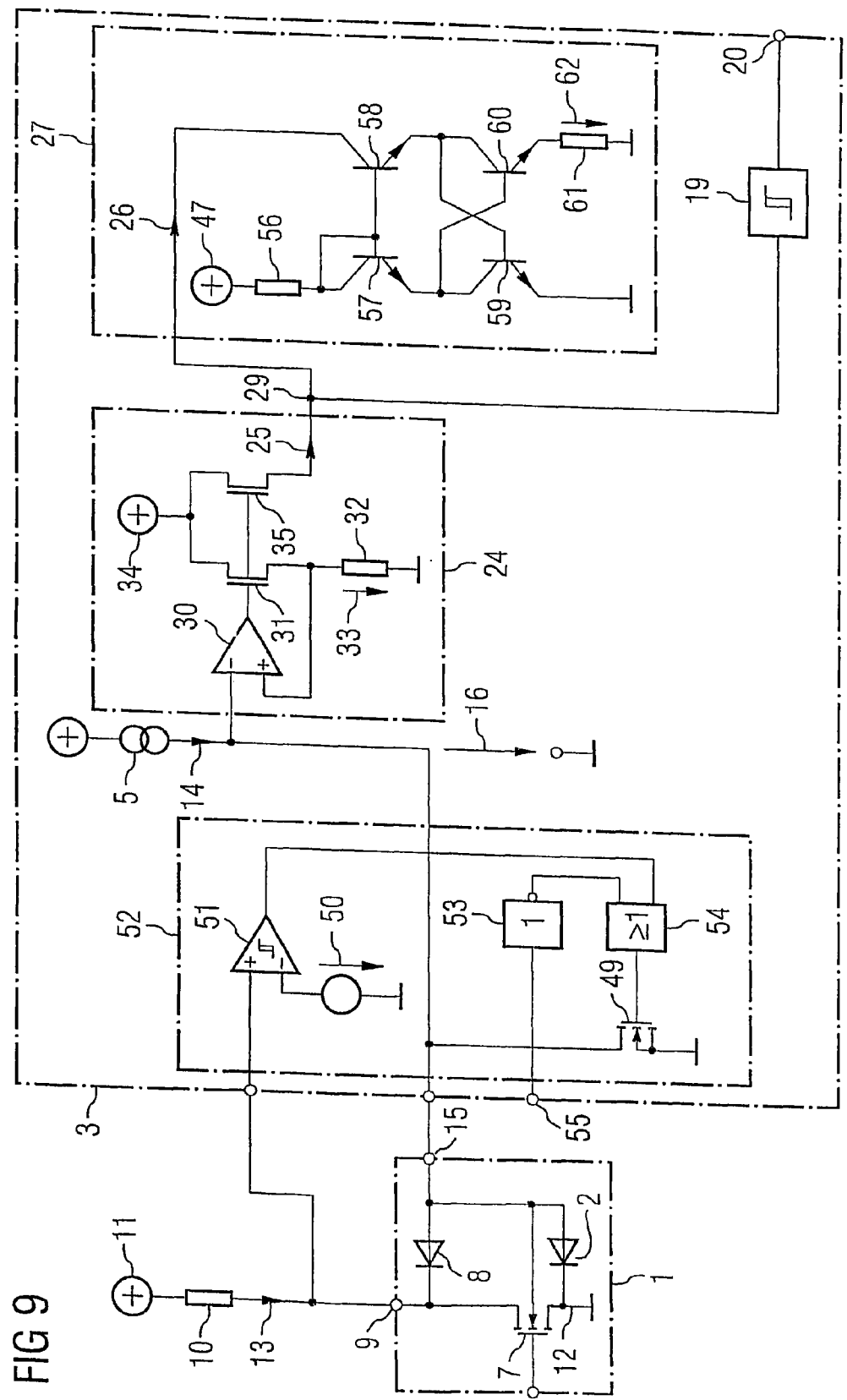
FIG. 9 is a circuit diagram of a temperature sensor integrated in a semiconductor body, with parasitic diode structure and a separate evaluating unit with external activation of the measurement according to a fourth embodiment of the invention.

In the circuit arrangement according to FIG. 9, a further embodiment of a circuit for overtemperature detection of a power transistor structure 7 with a monitoring circuit 52, extended with respect to FIG. 8, and a further embodiment of the voltage/current converter 27 is provided. Semiconductor body 1 and voltage/current converter 24 correspond to those shown in FIG. 8.

The monitoring circuit 52 contains an inverter 53, an OR gate 54 and an MOS field effect transistor 49. A logical input signal is fed in at a terminal 55 of the evaluating unit 3 in order to be able to activate and deactivate the evaluating circuit 3 from the outside. Compared with the embodiment according to FIG. 8, the output of the comparator 51 is not connected directly to the gate terminal of the transistor 49 but initially to a first input of the OR gate 54. The terminal 55 is connected to the input of the inverter 53, the output of which is connected, in turn, to a second input of the OR gate 54, the output of the OR gate 54 being coupled to the gate terminal of the transistor 49.

The logic level H (power transistor structure 7: "ON") at terminal 55 of the evaluating unit 3 stands for the case in which the temperature detection and the monitoring of the voltage at the drain terminal 9 is to be activated, wherein this level can be generated, for example, by a load connected via the power transistor structure 7. The logic level H at the terminal 55 is converted into the logic level L by the inverter 53 and applied to the second input of the OR gate 54. If the output signal of the comparator 51 has the logic level L, that is to say the voltage at the drain terminal 9 of the power transistor structure 7 is below the preset reference voltage 50, the temperature detection is carried out as described above.

If the output signal of the comparator 51 has the logic level H, that is to say the voltage at the drain terminal 9 of the power transistor structure 7 is above the preset reference voltage 50 and thus in a range which could result in the destruction of the semiconductor body 1, the diode structure 2 is again short circuited via the transistor 49, driven by the output signal from the OR gate 54. Such a case is, for example, that of an avalanche in which a bipolar transistor formed from the two diode structures 2 and 8, which is already active, forms the weak point. The temperature is therefore monitored only in the switched-through state of the power transistor structure 7 and/or when the voltage drops below the maximum permissible load path voltage predetermined by the voltage 50.

If the logic level L (power transistor structure 7: "OFF") is present at terminal 55 of the evaluating unit 3, temperature detection is deactivated. In this event, the logic level L at terminal 55 is first converted into the logic level H via the inverter 53 and applied to the second input of the OR gate 54. Independently of the value of the level present at the first input of the OR gate 54 (from output of the comparator 51), a signal with the logic level H is thus generated in every case at the output of the OR gate 54 and the diode structure 2 is again short circuited via the transistor 49. As stated above, the signal 20 cannot be used for overtemperature detection in all cases in which the diode structure 2 is short circuited via the transistor 49.

FIG. 9 also shows a further embodiment of the voltage/current converter 27 from FIG. 7 which has a supply potential 47, a resistor 56, a resistor 61, a bipolar transistor 57, a bipolar transistor 58, a bipolar transistor 59 and a bipolar transistor 60. In this arrangement, the transistor 57 is connected with its collector terminal to the supply potential 47 via the resistor 56. The base terminal of the transistor 57 is connected to the base terminal of the transistor 58 and to the collector terminal of the transistor 57. The collector terminal of the transistor 58 is connected to the node 29 at which the current 25 from the voltage/current converter 24 and the current 26 into the voltage/current converter 27 are subtracted from one another for the purpose of evaluation by the comparator 19 and thus for generating the signal 20. Furthermore, the emitter terminal of the transistor 57 is connected to the collector terminal of the transistor 59, the emitter terminal of the transistor 58 is connected to the collector terminal of the transistor 60, the emitter terminal of the transistor 57 is connected to the base terminal of the transistor 60 and the emitter terminal of the transistor 58 is connected to the base terminal of the transistor 59. The emitter terminal of the transistor 59 is connected directly to ground; the emitter terminal of the transistor 60 is connected to ground via the resistor 61. The limit value of the overtemperature is again dependent on the ambient temperature at the evaluating unit 3. Similarly, by suitably using resistor components of the same material for the resistors 32 and 61 in the voltage/current converters 24 and 27, the absolute accuracy tolerances of these resistors and thus different temperature dependences reducing the measuring accuracy are again compensated for and the absolute accuracy of the overtemperature detection is thus distinctly increased.

The exemplary embodiments do not show start-up circuits which could be necessary under some circumstances when switching on the circuit arrangement but which do not have any significance for the basic function of the circuit arrangement and have therefore been omitted for the sake of clarity. The expert can however easily use known start-up circuits for the respective purpose.

While the invention disclosed herein has been described in terms of several different embodiments, there are numerous alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A circuit arrangement for detecting the overtemperature of a semiconductor body, the circuit arrangement comprising:
   at least one field effect transistor including a load terminal;
   a parasitic diode integrated in the semiconductor body, the parasitic diode connecting the load terminal of the field effect transistor to a bulk terminal of the semiconductor body;
   an evaluating unit electrically connected to the parasitic diode via the bulk terminal at the semiconductor body, the evaluating unit configured to feed a current into the parasitic diode and evaluate a temperature-dependent voltage drop across the parasitic diode, the direction of the current fed into the diode being such that it is operated in the forward direction;
   wherein the evaluating unit comprises a short circuit device operable to temporarily short circuit the parasitic diode;
   wherein the voltage across a load path of the field effect transistor is monitored; and
   wherein the evaluating unit is configured to be deactivated when a further limit value is exceeded by the voltage across the load path of the field effect transistor.

2. The circuit arrangement as claimed in claim 1 wherein the field effect transistor is provided as a power transistor structure.

3. The circuit arrangement as claimed in claim 1, wherein the field effect transistor provides a power transistor structure, wherein the short circuit device is configured to short circuit the parasitic diode when the field effect transistor is switched on and a voltage occurs along a drain-source path of the power transistor structure which is above a preset comparison voltage.

4. The circuit arrangement as claimed in claim 1, wherein the short circuit device is configured to short circuit the parasitic diode when the field effect transistor is switched off and a voltage occurs at a drain terminal of the power transistor structure which is above a preset comparison voltage.

5. The circuit arrangement as claimed in claim 1, wherein the short circuit device is configured to short circuit the parasitic diode if an operating voltage, which is above a preset comparison voltage, provides for an excessive voltage at a drain terminal of the power transistor structure.

6. The circuit arrangement as claimed in claim 1, wherein the short circuit device includes a switching element, and wherein the evaluating unit is an external evaluating unit, the short circuit device being arranged in the external evaluating unit.

7. The circuit arrangement as claimed in claim 1, wherein the field effect transistor includes a load path, wherein the parasitic diode is connected to a further parasitic diode as diodes in series opposition, and wherein the diodes in series opposition are connected in parallel with the load path of the field effect transistor.

8. The circuit arrangement as claimed in claim 1, wherein the evaluating unit is thermally decoupled and arranged separately from the semiconductor body.

9. The circuit arrangement as claimed in claim 1, wherein the evaluating unit is configured to compare the voltage drop across the parasitic diode with a preset comparison voltage.

10. The circuit arrangement as claimed in claim 1, wherein the evaluating unit is configured to compare the voltage drop across a diode structure in the evaluating unit with a comparison voltage dependent on the temperature of the evaluating unit.

11. The circuit arrangement as claimed in claim 9, wherein the evaluating unit is configured to generate an overtemperature detection signal when a predeterminable difference of the voltage drop across the parasitic diode and the preset comparison voltage is reached.

12. The circuit arrangement of claim 10, wherein the evaluating unit comprises current/voltage converters configured to convert the voltage drop across the diode structure and/or the comparison voltage into currents.

13. The circuit arrangement as claimed in claim 12, wherein the evaluating unit is configured to generate an overtemperature detection signal when a predetermined difference of the currents is reached.

14. The circuit arrangement as claimed in claim 10, wherein the current/voltage converters comprise resistor components of the same material.

15. The circuit arrangement as claimed in claim 1, wherein the evaluating unit is configured to be activated or deactivated by an external signal.

16. The circuit arrangement as claimed in claim 7, wherein the parasitic diode is a source-bulk diode inherent in the field effect transistor.

17. The circuit arrangement as claimed in claim 7, wherein the further parasitic diode is a drain-bulk diode inherent in the field effect transistor.

* * * * *